US011226370B1

(12) United States Patent
Mendelson et al.

(10) Patent No.: US 11,226,370 B1
(45) Date of Patent: Jan. 18, 2022

(54) RECOVERABLE EXCEPTIONS GENERATION AND HANDLING FOR POST-SILICON VALIDATION

(71) Applicant: International Business Machines Corporation, Armonk, NY (US)

(72) Inventors: Hillel Mendelson, Kibbutz Hahotrim (IL); Vitali Sokhin, Haifa (IL); Tom Kolan, Haifa (IL); Hernan Theiler, Haifa (IL); Shai Doron, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/017,663

(22) Filed: Sep. 10, 2020

(51) Int. Cl.
*G01R 31/28* (2006.01)
*G01R 31/3177* (2006.01)
*G01R 31/3183* (2006.01)
*G06F 11/36* (2006.01)
*G06F 11/22* (2006.01)
*G06F 11/263* (2006.01)

(52) U.S. Cl.
CPC ..... *G01R 31/2896* (2013.01); *G01R 31/3177* (2013.01); *G01R 31/318314* (2013.01); *G06F 11/2236* (2013.01); *G06F 11/263* (2013.01); *G06F 11/3688* (2013.01)

(58) Field of Classification Search
CPC ............ G01R 31/2896; G01R 31/3177; G01R 31/318314; G06F 11/263; G06F 11/3688; G06F 11/2236
USPC .................................. 714/738, 742, 724, 28
See application file for complete search history.

(56) References Cited

U.S. PATENT DOCUMENTS

| 6,247,169 B1* | 6/2001 | DeLong ............... G06F 9/4843 712/244 |
| 6,480,818 B1* | 11/2002 | Alverson .............. G06F 11/362 703/26 |
| 8,381,040 B2* | 2/2013 | Almog ............... G06F 11/3688 714/45 |
| 8,990,622 B2* | 3/2015 | Landa .................. G06F 11/263 714/28 |
| 9,858,371 B1 | 1/2018 | Ovadia |
| 10,061,672 B2* | 8/2018 | Dagan ................. G06F 11/2236 |
| 10,534,881 B2 | 1/2020 | Schieve |
| 2011/0066486 A1* | 3/2011 | Bassin ................ G06Q 10/103 705/14.43 |
| 2011/0066890 A1* | 3/2011 | Bassin ............... G06F 11/3672 714/37 |

(Continued)

OTHER PUBLICATIONS

Kolan et al., Post-Silicon Validation of the IBM POWER9 Processor, Mar. 1, 2020, IEEE, pp. 999-1002. (Year: 2020).*

(Continued)

*Primary Examiner* — John J Tabone, Jr.
(74) *Attorney, Agent, or Firm* — Richard B. Thomas

(57) ABSTRACT

Embodiments relate to a system, program product, and method for random generation of recoverable errors in the generated instruction stream for post-silicon validation testing. The intentional raising and handling of exceptions in post-silicon validation exercisers randomly creates recoverable errors in a generated instruction test stream. Multiple exceptions may be raised either in a single instruction or in multiple instructions, while the present instruction is permitted to fully execute. The errors responsible for raising the exceptions are automatically repaired.

20 Claims, 6 Drawing Sheets

(56) References Cited

U.S. PATENT DOCUMENTS

| | | |
|---|---|---|
| 2011/0087861 A1 | 4/2011 | Bertacco |
| 2011/0099431 A1* | 4/2011 | Almog ................ G06F 11/3688 |
| | | 714/45 |
| 2013/0290073 A1* | 10/2013 | Bassin ............... G06Q 30/0244 |
| | | 705/7.37 |
| 2014/0173222 A1* | 6/2014 | Alapati .............. G06F 12/0897 |
| | | 711/144 |
| 2016/0224448 A1* | 8/2016 | Park ...................... G06F 11/263 |

OTHER PUBLICATIONS

Adir et al., Verification of Transactional Memory in POWER8, Jun. 1, 2014, IEEE, pp. 1-6. (Year: 2014).*

Adir et al., "Threadmill: A Post-Silicon Exerciser for Multi-Threaded Processors," 2011 48th ACM/EDAC/IEEE Design Automation Conference (DAC), Jun. 5-9, 2011, p. 860-865.

Storm, "Random Test Generators for Microprocessor Design Validation," Sun Microsystems Inc., May 12, 2006, 59 pages.

Zhang et al., "Amplifying Tests to Validate Exception Handling Code," 2012 34th International Conference on Software Engineering (ICSE) Digital Object Identifier, Jun. 2-9, 2012, p. 595-605. <https://digitalcommons.unl.edu/cgi/viewcontent.cgi?article=1211&context=cseconfwork>.

* cited by examiner

RECOVERABLE EXCEPTIONS GENERATION AND HANDLING FOR POST-SILICON VALIDATION

BACKGROUND

The present disclosure relates to testing semiconductor integrated circuits, and, more specifically, to generating and handling recoverable exceptions in post-silicon validation exercisers.

Many known verification systems and methods are configured to test semiconductor integrated circuits prior to, and after fabrication of the integrated circuits. Prior to fabrication, software-based verification tools are employed to test the integrated circuit designs and features through pre-silicon test generation. Upon fabrication of an integrated circuit prototype, the prototype is physically tested through a validation platform where the testing is typically performed through one or more bare-metal hardware exercisers. The testing is constrained to using test templates that are developed on the pre-silicon systems prior to the post-silicon validation testing. In many of the known post-silicon validation systems and methods, intentional insertion of exceptions into the testing is limited due to the computational complexity of such testing techniques, where time allotted for post-silicon testing is typically limited. For those exceptions that are unintentionally created, many of the known post-silicon validation systems and methods include a "skip-to-next" technique to handle exceptions in the test scenarios where such exceptions are introduced. The "skip-to-next" technique handles the introduced exceptions through skipping to the next testing instruction without fully resolving the exceptions.

SUMMARY

A system, computer program product, and method are provided for generation and handling of recoverable exceptions in post-silicon validation testing.

In one aspect, a computer system is provided to facilitate generation and handling of recoverable exceptions in post-silicon validation testing. The system includes a validation computer system including one or more processing devices configured to validate operation of a device-under-test (DUT) through post-silicon validation testing. The system also includes one or more memory devices communicatively coupled to the processing device. The one or more processing devices are configured to execute one or more post-silicon validation tests on the DUT including to generate a test program from the one or more test templates and create one or more exception conditions and one or more respective exception handlers. The one or more processing devices are configured to are also configured to generate, through the test program, a first instruction configured to randomly raise one or more first exceptions. In addition, the one or more processing devices are configured to resolve, at least partially, subject to the generation of the first instruction, the one or more first exceptions, and modify, subject to the resolution of the one or more first exceptions, the first instruction. In addition, the one or more processing devices are configured to raise, subject to the modifications, one or more second exceptions within the first instruction.

In another aspect, a computer program product is provided for generation and handling of recoverable exceptions in post-silicon validation testing. The computer program product includes one or more computer readable storage media, and program instructions collectively stored on the one or more computer storage media. The product includes program instructions to execute one or more post-silicon validation tests for a device-under-test (DUT) including program instructions to generate a test program from one or more test templates and program instructions to create one or more exception conditions and one or more respective exception handlers. The product also includes program instructions to generate, through the test program, a first instruction configured to randomly raise one or more first exceptions from the one or more first exception conditions and program instructions to resolve, at least partially, through the one or more exception handlers, subject to the generation of the first instruction, the one or more first exceptions. The product further program instructions to modify, through the one or more exception handlers, subject to the resolution of the one or first exceptions, the first instruction, and program instructions to raise, through the one or more exception handlers, subject to the one or more modifications, one or more second exceptions within the first instruction.

In yet another aspect, a computer-implemented method is provided to facilitate for generation and handling of recoverable exceptions in post-silicon validation testing. The method includes executing one or more post-silicon validation tests for a device-under-test (DUT) generating a test program from the one or more test templates. The method also includes creating one or more first exception handlers and one or more respective exception handlers and generating, through the test program, a first instruction configured to randomly raise one or more first exceptions from the one or more first exception conditions. The method further includes resolving, at least partially, through the one or more exception handlers, subject to the generation of the first instruction, the one or more first exceptions and modifying, through the one or more exception handlers, subject to the resolution of the one or first exceptions, the first instruction. The method also includes raising, through the one or more exception handlers, subject to the one or more modifications, one or more second exceptions within the first instruction.

The present Summary is not intended to illustrate each aspect of, every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1:
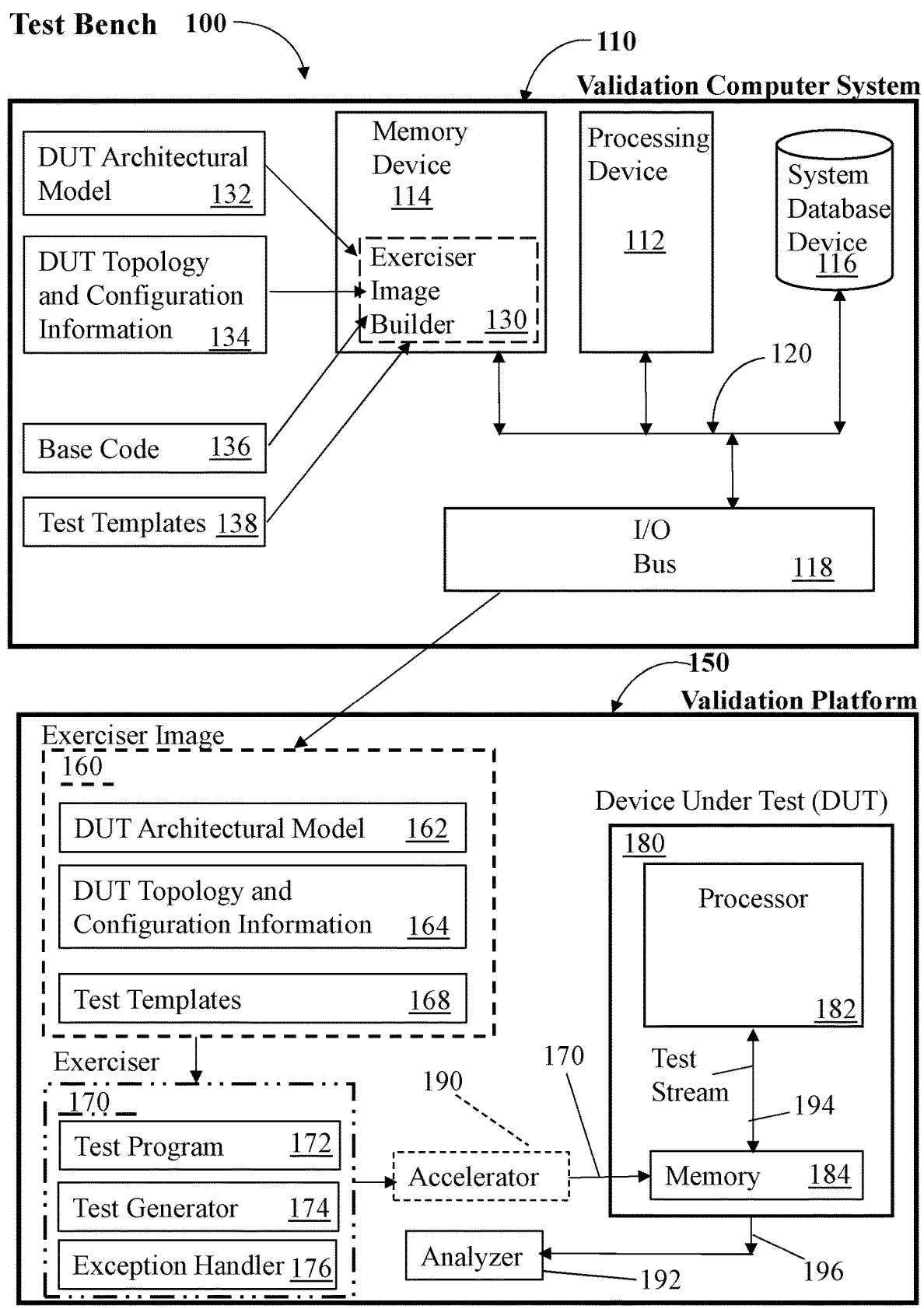
FIG. 1 is a schematic diagram illustrating a test bench including a validation computer system and a validation platform, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

It will be readily understood that the components of the present embodiments, as generally described and illustrated in the Figures herein, may be arranged and designed in a wide variety of different configurations. Thus, the following details description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Many known modern processors, e.g., processing devices such as central processing units (CPUs), include integrated circuitry therein to execute the desired functionality through one or more of computative functional units and logical functional units. In addition, many known hardware designs and fabrication processes include two distinct testing phases, i.e., pre-silicon verification testing and post-silicon validation testing, both of which are described further herein. Many known processor hardware verification and validation systems and methods are configured to test semiconductor integrated circuits prior to, and after fabrication of the respective integrated circuits. Verification tools used for the manufacturing of hardware processors validate the desired behavior of the hardware given all system conditions, including proper interrupt handling features. For example, and without limitation, such interrupt handling includes the ability to recover from exceptional (or fault) conditions, i.e., exceptions, raised as a result of a computational error, such as, and without limitation, a user providing abnormal input, a file system error being encountered when trying to read or write a file, an intentionally inserted breakpoint (or pause) within the instructions, a program attempting to divide by zero, and invalid memory access. Such exceptions may further include, without limitation, faults with respect to page handling, security, protection, alignment, and any special hardware features. In general, an exception breaks the normal flow of execution of the instructions, i.e., an exception is raised when an unexpected event happens that requires special processing. One major role of a CPU (in concert with the operating system) is the correct handling of the exceptions.

Prior to fabrication, software-based verification tools are employed to test the integrated circuit designs and features through pre-silicon verification test generation. Many of the planned testing exceptions may be of high complexity. For example, test generation tools are required to take into account these exception conditions, thus making the test generation a complex task. More specifically, in at least some embodiments of these known systems and methods, the correct conditions to raise exceptions are manually integrated into the test scenarios, thereby increasing the complexity of the test templates and the associated computational constraints.

As previously alluded to, exceptions are anomalies raised as a result of exceptional conditions generated by errors within the code or hardware requiring special actions by the CPU to resolve during execution of a program. Preferably, the raised exceptions are resolved while the CPU is executing the particular line of code that initiated the exceptions. The pre-silicon verification testing of an ultra-high fidelity model of an integrated circuit design is performed on a computer-implemented simulation and testing platform that can leverage an operating system and testing software, i.e., testing tools in a virtual environment with sophisticated simulation, emulation, and formal verification tools. Such tools include, e.g., and without limitation, complex constraint satisfaction problems (CSPs) and a reference model. CSPs are mathematically-based devices defined as a set of objects whose state must satisfy a number of constraints and limitations. In addition, CSPs represent the entities in a problem as a homogeneous collection of finite constraints over variables, which is solved by constraint satisfaction methods. A reference model is an architecturally accurate simulation of the integrated circuit, including the ability to emulate the intended behaviors of the integrated circuit as a result of each of the instructions such as, without limitation, the state of the processor before and after the generation of each instruction. Therefore, the integrated software is tested with the respective software to verify the integrated functionality thereof. The results of the pre-silicon verification testing may be used to make adjustments to the design of the integrated circuit, including hardware and software. Accordingly, prior to testing physical prototypes of integrated circuits, a software simulation is performed to verify the design and functionality thereof.

Once the engineers are satisfied with the quality of the hardware design in a virtual environment, one or more prototypes will be fabricated, i.e., a post-silicon product will be fabricated. The post-silicon product or prototype may be referred to as a circuit, a silicon, a processor, and as a hardware device, where the term "physical integrated circuit prototype" is used herein. Upon fabrication of a physical integrated circuit prototype subsequent to the pre-silicon verification testing, the prototype is physically tested to capture any deficiencies not captured during the pre-silicon verification testing. The post-silicon validation testing is executed through a validation platform, and more specifically, through one or more bare-metal hardware exercisers. These exercisers are programs that run on the physical integrated circuit prototype, i.e., the device-under test (DUT), generate the test scenarios, execute the test scenarios, and verify the results of the test scenarios. In general, to facilitate high silicon utilization within the DUT, the exerciser's software should be lightweight and simple, which is contrasted with complex test generation and extensive, complex computation. In accordance with the lightweight and simple requirements, the post-silicon validation testing is executed without the aid of an operating system, therefore the testing is executed bare-metal with simple exerciser software. Accordingly, the exerciser runs on hardware, for example, the DUT, and in some embodiments, in conjunction with an accelerator to attempt to obtain the desired processing speeds without the operating system. In some embodiments, one or more analyzers or analysis devices, e.g., without limitation, oscilloscopes, are coupled to the DUT to collect operational data or to aid the debugging process.

The exercisers typically include the test programs to be run, a test generator to manage the generation and execution of the testing program, including to generate instructions that may raise an exception, and one or more exception handlers to resolve the exceptions through correcting either the affected instruction or the environment in such a way that the instructions can be completed. The exception handlers are implemented code that stipulates what a program will do when an anomalous event, i.e., an exception, disrupts the normal flow of that program's instructions. The exception handlers have the option to restart the computation and the beginning of the instruction, resume, or unwind. This feature allows the program to continue the test execution at exactly the same place where the error occurred.

The test program with the intended test sequences is generated prior to the testing and is loaded onto the silicon DUT and the testing is executed by the processor. The testing is performed in a sequence-to-sequence manner, where each sequence is at least a little different that the other sequences and the sequences are selected from the test program to run randomly by the test generator. The testing is constrained to using test templates to generate the test program that will be used to perform the post-silicon validation testing. In many of the known post-silicon validation systems and methods, intentional insertion of deliberate errors into the testing, to raise the respective exceptions, is not performed due to the computational complexity of such testing techniques. Intentionally generating error conditions to raise the exceptions is a computationally intense task. The test generator will necessarily include instructions for, without limitation, which errors to run and not run, and exception conditions to be created as a result of the errors, as well as exception conditions to not be created. The time allotted for post-silicon testing is typically limited, also the post-silicon prototype may have limited functionality, and as a result, the test generator program must therefore be simple. Therefore, the test generator program cannot include sophisticated software like CSP and reference models (as available in pre-silicon verification) in at least some known testing schemes, and thus intentionally raised exceptions are typically not used, or used in limited fashion. For those exceptions that are unintentionally raised, many of the known post-silicon validation systems and methods include a "skip-to-next" technique to handle exceptions in the test scenarios when such exceptions are introduced. The "skip-to-next" technique handles the inadvertently introduced exceptions through skipping to the next testing instruction without fully resolving the exceptions, thus without completing entire execution of the intended test stream. The test generator within the exerciser facilitates validating the correct DUT behavior under all of the aforementioned exception conditions.

A system, computer program product, and method are disclosed and described herein for conducting post-silicon validation testing through the use of random generation of recoverable errors in the generated instruction stream. As described further herein, the intentional generation and handling of exceptions in post-silicon validation exercisers randomly creates recoverable errors in a generated instruction test stream. Such random raising of the exceptions eliminates the need to draft complex exception test scenarios, thereby reducing the necessity for additional manual work on the test templates. Multiple exceptions may be raised either in a single instruction or in multiple 1 instructions, while the present instruction is permitted to fully execute. The errors responsible for raising the exceptions are automatically repaired, i.e., resolved. Accordingly, the users' original intent of the respective test sequences are preserved through demonstrating the abilities of the device-under-test (DUT) to recover from one or more errors and exceptions while executing the associated instructions rather than merely skipping to the next instruction, thereby providing a distinct improvement to the execution of the test scenarios. Moreover, accordingly, the methods described herein improves the test scenarios through producing high-variably execution flows of exceptions throughout the test stream, which results in significant stress on the DUT and increases testing coverage for the DUT exception mechanisms.

In at least some embodiments, the post-silicon validation testing as described further herein includes two different generation and recovery operations, i.e., static generation and deterministic recovery operations (hereon collectively referred to as static-deterministic operations) and dynamic generation and indeterministic recovery operations (hereon collectively referred to as dynamic-indeterministic operations). Each of the two generation and recovery operations includes one or more generation operations and one or more recovery operations. The selection of the respective generation and recovery operation is based on one or more of user preference and the nature of the exceptions to be generated during the validation.

In some embodiments, the static generation operations include raising static exceptions and observing the respective deterministic recoveries. To perform the static raising of the exceptions, the test templates are created to generate the test program that is resident within the exerciser for execution of the test program by the test generator, also resident in the exerciser. Each of the test templates is configured to test one or more selected functions of the DUT. The test generator creates the variable exception conditions at test generation, where the various exception conditions are randomized with respect to the nature of the exceptions and the timing of the exceptions. Such randomization of insertion of the exception conditions into the testing sequences facilitates static raising of random exceptions. As described further herein, examples of such exceptions include, without limitation, deliberate creation of multi-exception conditions on a single instruction, or, in some cases, interactive instructions, and directed recoverable errors or faults on instructions. The generation condition is "static" in that the test scenarios resident within the test program already include the testing instructions to raise the predetermined exceptions, even though the actual insertion of the exceptions may be random. The random insertion of predetermined exception conditions into the test sequences prior to the initiation of the testing facilitates randomly raising exceptions without incurring the computationally heavy overhead within the test templates and the generator program.

The recovery condition is "deterministic" in that the exception recovery operations include one or more exception handlers, residing in the exerciser, to recover the trapped exceptions and return to execute the current instruction The respective exception handlers' ability to recover from various exception conditions is therefore deterministic in nature. In at least some embodiments, the exception handlers are pre-built software artifacts that are created as part of the exerciser software in conjunction with the respective created exception conditions. An exception is "trapped" when the exception is discovered by the CPU, the type of exception and the state of the program execution when it occurred are used to create an exception object, and the exception object is passed to the exception handlers to resolve the exception through employing specialized code such that execution of that particular instruction that initiated the exception may complete. In the deterministic exception recovery operations as used herein, the exceptions are substantially universally resolved through predetermined, i.e., deterministic mechanisms. In some embodiments, exceptions that would typically employ a static-deterministic operation include, without limitation, page faults, protection faults, alignment faults, security faults, and watch-point events. Accordingly, for those exceptions that are raised subject to the randomly inserted predetermined exception conditions into the test sequences and are trapped and resolved for the affected instruction to complete, static-deterministic operations are employed.

In some embodiments, dynamic-indeterministic operations include generating dynamic exceptions and observing the respective indeterminate recoveries. To perform dynamic generation of the exceptions, the generation of the test instructions with the embedded fault conditions to raise one or more exceptions is similar to that described for the static generation operations as previously described. Specifically, the test templates are created to generate the test program that is resident within the exerciser for execution of the test program by the test generator, also resident in the exerciser. However, in contrast to the static generation operations, where the random exception conditions are inserted prior to the start of the testing, for the dynamic generation operations, the test generator creates the variable exception conditions at test generation, where the various exception conditions are randomly introduced on the fly during the test execution. Therefore, such randomization of insertion of the exception conditions into the testing sequences during the testing facilitates dynamic generation of random exceptions. In some embodiments, exceptions that would typically employ a dynamic-indeterministic operation include, without limitation, multi-threaded test scenarios where various threads introduce exception conditions to other threads. e.g., without limitation, one thread loads, and the other thread invalidates the load address in a loop. In addition, as described further herein, another example of exceptions generated through dynamic-indeterministic operations include, without limitation, deliberate creation of multi-exception conditions on a single instruction, or, in some cases, interactive instructions. The generation condition is "dynamic" in that the test scenarios resident within the test program do not include testing instructions to generate static predetermined exceptions prior to the commencement of testing. The random insertion of exception conditions into the test sequences on the fly facilitates randomly generating exceptions without incurring the computationally heavy overhead within the test templates and the generator program.

The recovery condition is "indeterministic" in that the recovery operations include the one or more exception handlers, residing in the exerciser, to attempt to recover the trapped exceptions. Similar to the deterministic recoveries, in at least some embodiments, the exception handlers are pre-built software artifacts that are created as part of the exerciser software in conjunction with the respective created exception conditions. However, unlike a deterministic recovery operation, where an exception is resolved and the DUT continues to execute the current instruction, in the indeterministic condition the exception handlers recover, at least partially, in a random fashion, e.g., in some instances the respective exception handlers recover all types of exceptions, or only partially recover randomly selected conditions. In addition, as discussed further herein, the dynamic-indeterministic operations leverage the exception handlers to dynamically generate subsequent exceptions upon at least partial recovery from the initial exceptions. Accordingly, for those exceptions within multi-threaded test scenarios that are generated and trapped, dynamic-indeterministic operations are employed.

In at least some embodiments, the post-silicon validation testing includes two processes, i.e., a generation process and a recovery process. In some embodiments, for example, for those embodiments that employ static-deterministic operations, the static generation process includes randomly tampering with the test generation by injecting exception conditions, including recoverable errors into the test stream that can be resolved/recovered during test execution via the respective exception handler, such tampering being performed prior to the commencement of the testing. In general, for the static-deterministic operations, the generation process includes prospectively adding the random generation of intentional recoverable errors in the generated instruction test stream. Also, in general, for employing dynamic-indeterministic operations, the dynamic generation process includes adding the random generation of recoverable errors in the generated instruction test stream test once the testing has commenced. Further, in general, the randomization is done across various exception conditions from a set of resolvable/recoverable exceptions, thereby facilitating creation of multi-exception conditions. Accordingly, regardless of whether a static generation operation or a dynamic generation operation is selected, the insertion of the exceptions into the instructions will be randomized.

In one or more embodiments, the dynamic generation process includes facilitating deliberate creation of multi-exception conditions on a single instruction, or, in some cases, interactive instructions. In some embodiments, as discussed further herein, for the dynamic generation operations, the multi-exception conditions are created by the respective exception handlers, implemented to raise the respective self-modifying exceptions, during a recovery from a first exception condition. As described above, such single-instruction, multi-exception conditions may employ either static-deterministic operations or dynamic-indeterministic operations. In at least some embodiments, the single-instruction, multi-exception conditions may be employed to analyze resolution of, for example, and without limitation, page faults, protection faults, alignment faults, security faults, and watch-point events. In addition, combining multiple exception conditions on a single instruction may be used to analyze and verify that all the test exceptions on that instruction are generated and resolved in the correct order, thereby verifying the proper sequencing of the recovery operations for most efficient and effective recoveries. Furthermore, for those testing regimes that exercise scatter-store and gather-load instructions with respect to loading or storing multiple elements at a time, combining multiple exception conditions on a single instruction may be used to analyze and resolve exceptions associated with accessing non-contiguous elements through access to non-contiguous memory locations, including, without limitation, raising multiple exceptions on numerous pages in memory, raising multiple exceptions on different elements, and raising multiple exceptions of different types on the same element. Accordingly, creating multi-exception conditions on a single instruction facilitates a through testing of the DUT's abilities to correctly resolve substantially worse-case multiple exception scenarios.

In at least some embodiments, dynamic-indeterministic operations may be employed to generate directed recoverable errors on the present instruction at random in a manner that also generates one or more exceptions through one or more instructions subsequent to the present instructions being processed. In some embodiments, as discussed further herein, the multi-exception conditions are created by the respective exception handler, implemented to generate the respective self-modifying exceptions, during a recovery from a first exception condition. For example, and without limitation, an intentionally inserted breakpoint (or pause) within a present instruction is used to test the DUT and an exception is generated. In some embodiments, the breakpoint register is moved to the next instruction. Accordingly, the dynamic-indeterministic operations may be employed to generate exceptions on subsequent instructions.

In addition, in some embodiments, static-deterministic and dynamic-indeterministic operations may be employed in a parallel manner to generate intentional testing sequences at random including implementation of "real-life scenarios" that include raising exceptions that require handling through resolution processes that are similar to those that would be employed by the intended operating system that will be used through the DUT. In some embodiments, as discussed further herein, the multi-exception conditions are created by the respective exception handler, implemented to generate the respective self-modifying exceptions, during a recovery from a first exception condition. For example, and without limitation, for an exception raised through a page fault, the exception handler may include programming to resolve the page fault exception through validating the respective translation entries. Moreover, another non-limiting example includes exceptions raised through first fault load instructions where the exception handler will substantially simulate validating the respective translation entry of a randomly, but intentionally, inserted first fault and will update the predicate register accordingly. This testing sequence will be repeated in a loop until no further faults occur such that a successful load of all elements with no incurred fault is achieved. Furthermore, a non-limiting example includes exceptions raised through a protection fault, where the exception handler is programmed to grant the proper permission to resolve the associated exception. Accordingly, even though the operating system is absent on the bare-metal validation operations described herein, resolution of exceptions that would typically be corrected by the operating system may still be performed through the static-deterministic and dynamic-indeterministic operations within the constraints for each as described herein.

Moreover, in some embodiments, static-deterministic and dynamic-indeterministic operations may be employed to generate intentional testing sequences at random including implementation of specialized testing scenarios. In some embodiments, as discussed further herein, the multi-exception conditions are created by the respective exception handler, implemented to raise the respective self-modifying exceptions, during a recovery from a first exception condition. For example, and without limitation, the test program and the exception handler may be programmed to create and resolve exception conditions that are unlikely to be resolved by the operating system. Specific non-limiting examples include resolving exceptions which normally wouldn't be resolved e.g. alignment exceptions and security exceptions. In addition, the testing scenarios may be implemented to deliberately generate conditions for multiple pending exceptions on a single instruction (as described further herein). Also, the testing scenarios may be configured to verify that the correct exception for a particular fault was taken. Accordingly, the static-deterministic and dynamic-indeterministic operations may be implemented to examine specialized exceptions and the recoveries therefrom within the constraints for each as described herein.

In at least some embodiments, static-deterministic operations and dynamic-indeterministic operations may be used together, including in parallel, for particular testing scenarios. Alternatively, in some embodiments, static-deterministic operations and dynamic-indeterministic operations may be applied individually.

In at least some embodiments, for the indeterministic recoveries, one or more exception handlers may be implemented to generate the previously described self-modifying exceptions. Specifically, the exception handlers may be implemented to modify or replace the current instruction to introduce even broader variability and stress on the CPU's exception mechanisms. For example, without limitation, the exception handlers may be implemented to randomly and dynamically raise multiple, and different, exceptions of various conditions from a single instruction in memory while the instruction itself is being modified between exception trapping. In addition, the exception handlers may be implemented to modify or replace the current instruction to randomly and dynamically raise different exceptions on subsequent instructions, i.e., the code may be altered dynamically as the instructions are processed. In addition, the exception handlers may be implemented to the aforementioned real-life scenarios and the specialized testing schemes. Accordingly, the exception handlers are configured to correct errors in a partially and random manner, so that more exceptions may be raised on the same instruction, or on the next instructions, upon resolution of a first exception, thereby applying exception conditions repeatedly, randomly, and dynamically during the validation test execution on any instruction(s) in the test scenarios through exception condition injection, thereby creating a cross-product effect.

As used herein, a cross product scenario relates to some sort of random real-time interaction/dependency between multiple threads, for example, without limitation, several threads that compete for a certain hardware resource. A more specific example for a cross-product scenario are two threads running simultaneously. The first thread repeatedly accesses memory for read/write operations while the second thread constantly invalidates data entries in translation mapping used by the first thread. This condition would cause the first thread to raise translation fault exceptions, where the exception handler is required to revalidate the translation data before the first thread can proceed to read/write the memory. Although such a scenario can be generated in a static-deterministic manner, real-time dependencies with random variabilities are generated dynamically during test execution.

Accordingly, the generation processes as described herein facilitate test generation that is less restrictive, i.e., more computationally-light as compared to generation of pre-silicon tests. The implemented generation operations as described herein do not include features to forbid exception conditions for either the static or dynamic operations. In addition, the light weight testing implementation facilitates free creation of directed scenarios, where the users can be less experienced, and further facilitates taking multiple exceptions on the same instruction or subsequent instructions. Moreover, the generation of multi-threaded test scenarios may include test scenarios that no CSP or reference model can verify during the pre-silicon verification testing. For example, for CSP and reference model testing exercises, if one thread loads and the other thread invalidates the load address in a loop, there is no way to guarantee that the address would be valid, without the ability to correct the exception. In this case directing a CSP to prevent exceptions, would end up in disabling the second thread with no further operations and analysis. Moreover, the methods described herein improve the test scenarios through producing high-variably execution flows of exceptions throughout the test stream, which results in significant stress on the DUT and increases testing coverage for the DUT exception mechanisms. Accordingly, the test generation as described herein facilitates stress testing the desired operation of the DUT.

In at least some embodiments, in addition to the generation operations, the in post-silicon validation testing as described herein includes recovery operations. The purpose of analyzing the recovery operations as described herein facilitates observation of how well the DUT recovers, deterministically and indeterministically, from the imposed exception conditions. In general, the recovery operations described herein do not forbid the creation of exception conditions through directions to skip to the next instruction when the present instruction generates an error that will likely lead to raising of an associated exception. In contrast, during test execution as described herein, pre-built exception handlers recover these errors in a manner that preserves the users' original intent of the test to demonstrate actual exception recovery of the DUT, resume the test at the same instruction that introduced the error, or errors, that generated the exceptions, and thereby facilitate test completion. The indeterministic recovery operations described herein, as executed by the exception handlers, also facilitate repairing errors in an at least partially random manner such that more exceptions would occur, dynamically, on the same instruction, or on the next instruction(s), thereby demonstrating the ability to recover from exceptions repeatedly and dynamically, thus stressing the exception recovery mechanisms of the DUT.

Moreover, in at least some embodiments, the exception handlers described herein are pre-built software-based artifacts that are created and tailored to recover from exceptions that might be raised during test execution, where such handlers resolve exception conditions repeatedly and dynamically during test execution on any instruction(s) in the test to validate the expected behavior of the implemented exception trapping. Furthermore, the exception handlers described herein are configured to serially resolve a first exception, pick up executing the respective instruction from either where it left off or from the beginning of the instruction, and for the dynamic generation operations, randomly and dynamically inject one or more additional exception conditions, i.e., errors to raise one or more additional exceptions in the present instruction (or subsequent instructions), resolve the additional exceptions in the proper order that facilitates proper operation of the DUT, and either to continue the cycle of exception insertion-to-exception resolution or complete the operation of the affected instruction. Accordingly, as the generation operations randomly inject recoverable errors in the generated instruction test stream during test execution, any sporadic exception that is trapped is recovered by the exception handlers, resulting in a continuous test stream that complies with the original scenario of the user.

In those embodiments that include employment of one or more static-deterministic operations, the recovery includes the respective exception handler recovering the one or more trapped initial exceptions and returning the DUT to execute the current instruction that initiated the exceptions. For those embodiments that include employment of one or more dynamic-indeterministic operations, the recovery includes the respective exception handler recovering in a random fashion, where the DUT may recover from any and all types of exceptions, or may only partially recover from randomly selected conditions. For those embodiments that include employment of one or more dynamic-indeterministic operations to create multi-exception conditions as described herein, the respective exception handlers recover in a random fashion by revalidating the various exception conditions. In addition, in some embodiments, the respective exception handlers may resolve the multi-exception conditions that raise multiple exceptions on one instruction resulting in exercising different microarchitecture (μarch) paths per each exception. Regardless of the use of static-deterministic operations and dynamic-indeterministic operations, the recovery operations are monitored to record the actual operation of the DUT to the randomly selected instructions based on the test template, with the associated errors, faults, and exceptions. Such operation of the DUT is compared to at least partially predicted results of the one or more random instruction sequences generated to at least partially verify the operation of the DUT. In addition, to fully verify the operation of the DUT, test scenarios may be rerun in a non-deterministic manner. Accordingly, the recovery operations provide further information to the user with respect to the exception resolution features of the DUT.

Referring to FIG. 1, a schematic diagram illustrating a computer system 100 including a validation computer system 110 and a bare-metal validation platform 150. In at least some embodiments, the computer system 100 is a test bench, therefore computer system 100 and test bench 100 are used interchangeably herein. The validation computer system 110 includes one or more processing devices 112 (only one shown), one or memory devices 114 (only one shown), one or more system database devices 116 (only one shown), and an input/output (I/O) bus 118 communicatively couple together through a bus network 120.

In one or more embodiments, an exerciser image builder 130 is resident within the memory device 114. The exerciser image builder 130 may be configured to generate an exerciser image 160 that will in turn be used to generate an exerciser 170 for testing a device-under-test (DUT) 180, both discussed further herein. The exerciser image builder 130 may be a computerized tool, such as implemented in hardware, software, or a combination thereof. The exerciser image builder 130 may be configured to take different inputs as data from which the exerciser image 160 may be built. In some embodiments, such inputs include a DUT architectural model 132 that may be utilized by the exerciser image builder 130 to generate test-cases that invoke different architectural aspects of the target device. As used herein, a "test-case" is a set of stimuli to the DUT 180 that may include instructions for the DUT 180 to process. The test-cases may further include initialization values to registers (not shown) of the DUT 180. The terms "test-case," "test scenario," and "test sequence" are used interchangeably herein.

Additionally, a DUT topology and configuration information 134 may be provided as an input to the exerciser image builder 130. The topology and configuration information 134 may be utilized by the exerciser image 160 to generate test-cases that test different aspects of the topology and configuration of the DUT 180. Further, in some embodiments, base code 136 may be provided as input, where the base code 136 may include program instructions to be added to exerciser image 160. In some embodiments, the exerciser image 160 may be based on the base code 136. The program instructions may be operative to provide predetermined operating system services and/or features to the bare-metal validation platform 150. Moreover, in some embodiments, one or more test templates 138 may be provided as input to facilitate the exerciser image 160 generating the battery of testing sequences that will be used to validate the DUT 180. The sources of the DUT architectural model 132, the DUT topology and configuration information 134, the base code 136, and the test templates 138 are any sources that enable operation of the test bench 100 as described herein. In addition, the DUT architectural model 132, the DUT topology and configuration information 134, the base code 136, and the test templates 138 may be stored in the system database device 116.

In some embodiments, the exerciser image builder 130 may be configured to manipulate any input provided to it before storing corresponding data in the system database device 116. In one embodiment, the exerciser image builder 130 may strip down information that is not needed by the exerciser image 160 and/or may pre-calculate information to reduce the amount of data to be retained in the exerciser image 160. Also, in at least some embodiments, the exerciser image 160 may include, or retain, additional useful information such as data and metadata associated with the DUT architectural model 132, the DUT topology and configuration information 134, the base code 136, and the test templates 138 based upon generation of present and previous test-cases. Accordingly, the exerciser image builder 130 includes sufficient data to build the exerciser image 160 that will be used to test the DUT 180.

The validation computer system 110 includes sufficient resources within the processing device 112, the memory device 114, and the system database device 116 to use the exerciser image builder 130 to build the exerciser image 160. The built exerciser image 160 is transmitted from the validation computer system 110 to the validation platform 150 through the I/O bus 118. In one or more embodiments, the exerciser image 160 includes sufficient program instructions configured to cause the DUT 180 to singly and repeatedly perform generation and execution of one or more test-cases. For example, a same test-case may be executed a plurality of times, and the results may be compared for consistency. In some embodiments, the exerciser image 160 may include sufficient code to provide the DUT 180 with functionality that is not provided by the bare-metal validation platform 150, such as, and without limitation, operating system features such as, without limitation, interrupt handlers, address translation, and memory management. Once the exerciser image 160 is loaded onto the validation platform 150, the exerciser image 160 may be executed by the DUT 180 to perform a functional and/or operational validation thereof.

The exerciser image 160 built and transmitted to the validation platform 150 by the validation computer system 110 includes the DUT architectural model 162, the DUT topology and configuration information 164, and the test templates 168 that are based on the DUT architectural model 132, the DUT topology and configuration information 134, and the test templates 138, respectively, that have been selected and modified by the validation computer system 110 for the particular scheduled tests for the DUT 180.

The validation platform 150 includes the exerciser 170 that is communicatively coupled to the exercise image 160. In some embodiments, the exerciser 170 includes a test program 172. The exercise image 160 is used to generate the particular test program 172 that will be executed and managed by a test generator 174 that is also embedded within the exerciser 170. The exerciser 170 also includes one or more exception handlers 176 (only one shown). The functionality of the exerciser 170 is discussed further herein with respect to FIGS. 2-3.

The validation platform 150 also includes sufficient physical space and connection ports to receive the DUT 180. In some embodiments, the DUT 180 includes a processor 182 and a memory 184 communicatively coupled to the processor 182. In some embodiments, additional devices may be embedded within the DUT 180. Also, in some embodiments, the validation platform 150 includes an accelerator 190 and an analyzer 192, e.g., and without limitation, an oscilloscope. The accelerator 190 may be used to accelerate the transmission of the exerciser 170 into the memory 184 of the DUT 180. In addition, in some embodiments, an accelerator (not shown) may be embedded within the DUT 180 to accelerate the test stream 194 transmission from the exerciser 170, now resident within the memory 184, to the processor 182 to decrease the overall testing time frame. The results and other data captured during the validation testing may be captured in suitable collection devices not shown or the validation computer system 110. or Accordingly, the validation platform 150 is configured to execute the validation testing of the DUT 180 through a bare-metal testing process.

Figure 2:
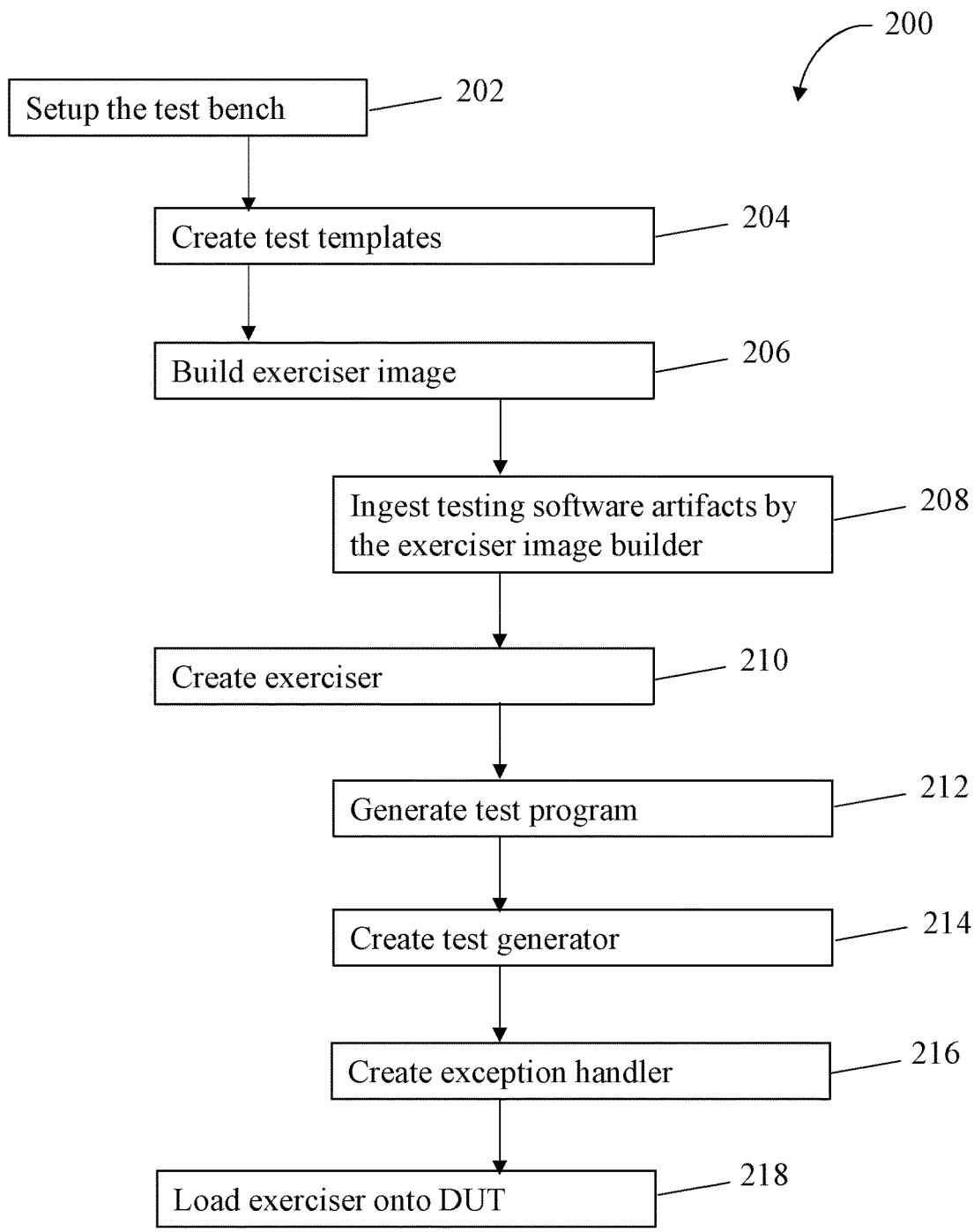
FIG. 2 is a flowchart of a process for setting up the test bench of FIG. 1 for executing one or more post-silicon validation tests for a device-under-test (DUT), in accordance with some embodiments of the present disclosure.

Referring to FIG. 2, a flowchart of a process 200 is provided for setting-up 202 the test bench 100 of FIG. 1 for executing one or more post-silicon validation tests for the device-under-test (DUT) 180 of FIG. 1, i.e., generating and handling exceptions in post-silicon validation testing. Referring to FIG. 1 as well, the test templates 138 are generated 204 and stored in the system database device 116. In some embodiments, the test templates 138 are previously created 202 and the library of test templates 138 will be selected for a particular test battery and may, or may not, be edited for such particular test battery. The exerciser image 160 is built 206 though ingestion 208 of testing software-based artifacts including, without limitation, the selected test templates 138, the DUT architectural model 132, the DUT topology and configuration information 134, and the base code 136 into the exerciser image builder 130. Accordingly, the setup 202 of the test bench 100 for the pending validation testing of the DUT 180 includes building 206 the exerciser image 160.

The exerciser 170 is created 210 from the exerciser image 160, where, in at least some embodiments, the creation 210 of the exerciser 170 includes generating 212 the test program 172 from the DUT architectural model 162, the DUT topology and configuration information 164, and the test templates 168 that are based on the DUT architectural model 132, the DUT topology and configuration information 134, and the test templates 138, respectively, that have been selected and modified by the validation computer system 110 for the particular scheduled tests for the DUT 180. The test program 172 includes the selected test-cases (test scenarios) including the test sequences and selected fault/error conditions that create the respective exception conditions. In some embodiments, the creation 210 of the exerciser 170 also includes creating the test generator 214 that is a software artifact that coordinates the scheduling of the test-cases, including the random and dynamic injection of the exception conditions.

Further, in some embodiments, the creation 210 of the exerciser 170 also includes creating 216 one or more exception handlers 176 to resolve the exceptions raised due to the injected exception conditions through correcting either the affected instruction or the environment in such a way that the present instruction can be completed. The exception handlers 176 are implemented code that stipulates what a program will do when an anomalous event, i.e., an exception, disrupts the normal flow of that program's instructions. In at least some embodiments, the respective exception handlers 176 are created substantially simultaneously with the respective exception conditions. The exception handlers 176 have the option to restart the computation and the beginning of the instruction, resume, or unwind. This feature allows the program to continue the computation at exactly the same place where the error occurred. In some embodiments, a unique exception handler 176 is used for each injected exception condition. In some embodiments, any configuration for the exception handler 176 is used that enables operation of the test bench 100 as described herein. The exerciser 170 is loaded 218 into the memory 184 of the DUT 180 to generate the test stream 194 that will test the processor 182 of the DUT 180. Accordingly, the operations associated with setup 202 of the test bench 100 include generating 212 the test program 172, the test generator 214, and the exception handlers 176, and loading such software artifacts of the exerciser 170 onto the DUT 180.

Figure 3:
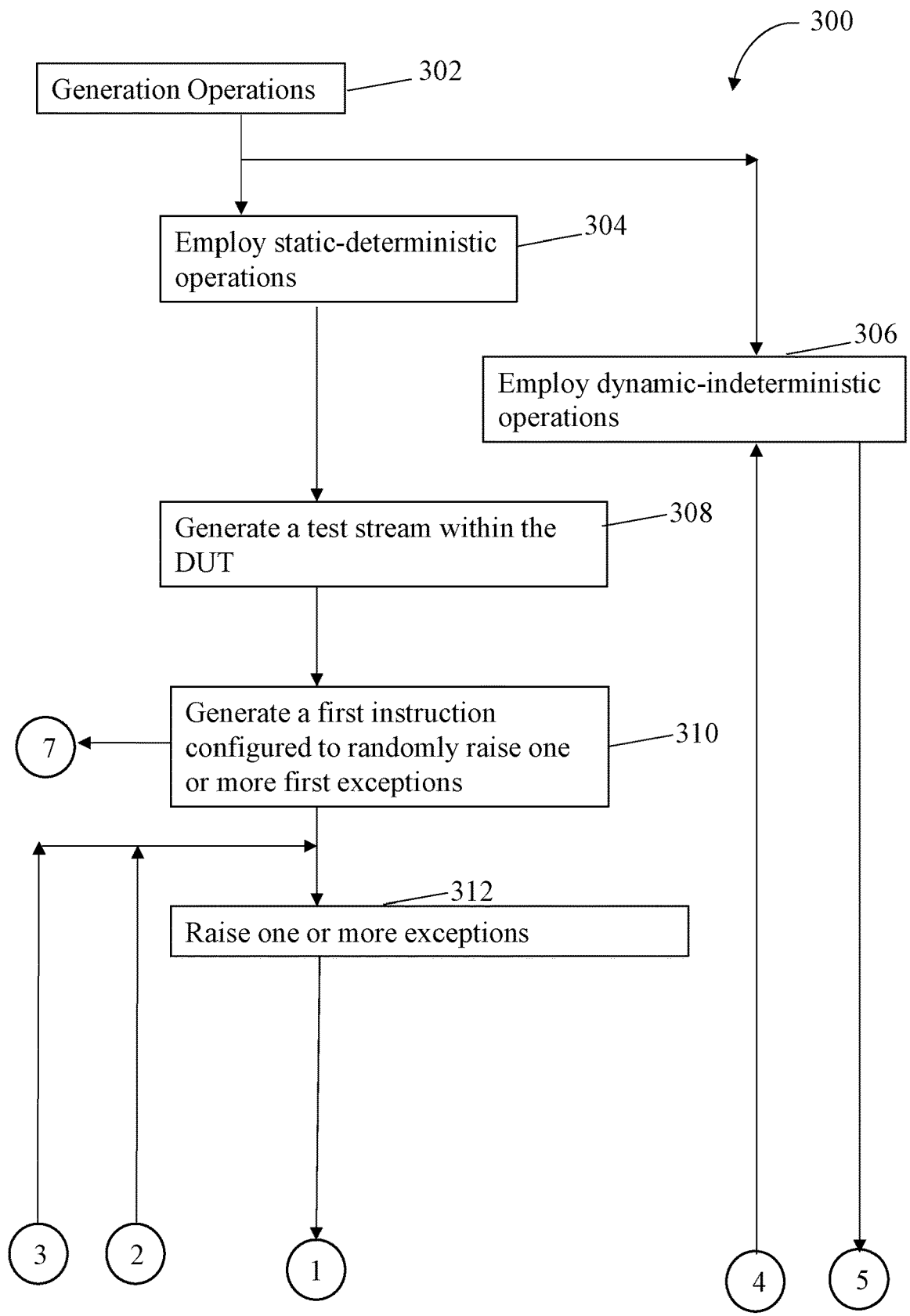
FIG. 3 is a flowchart of a process for generation operations for executing one or more post-silicon validation tests for the DUT, in accordance with some embodiments of the present disclosure.
Figure 3:
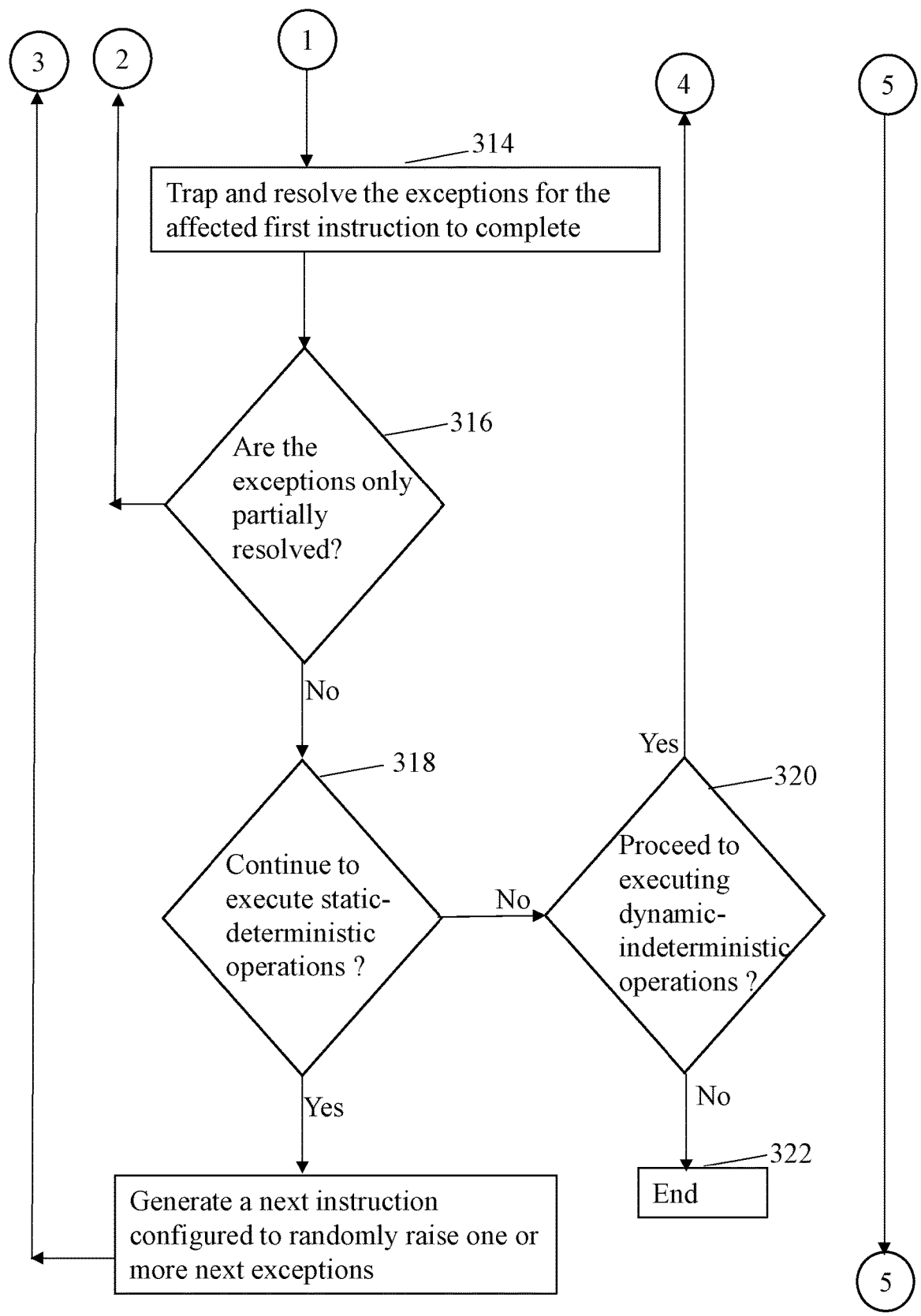
Figure 3:
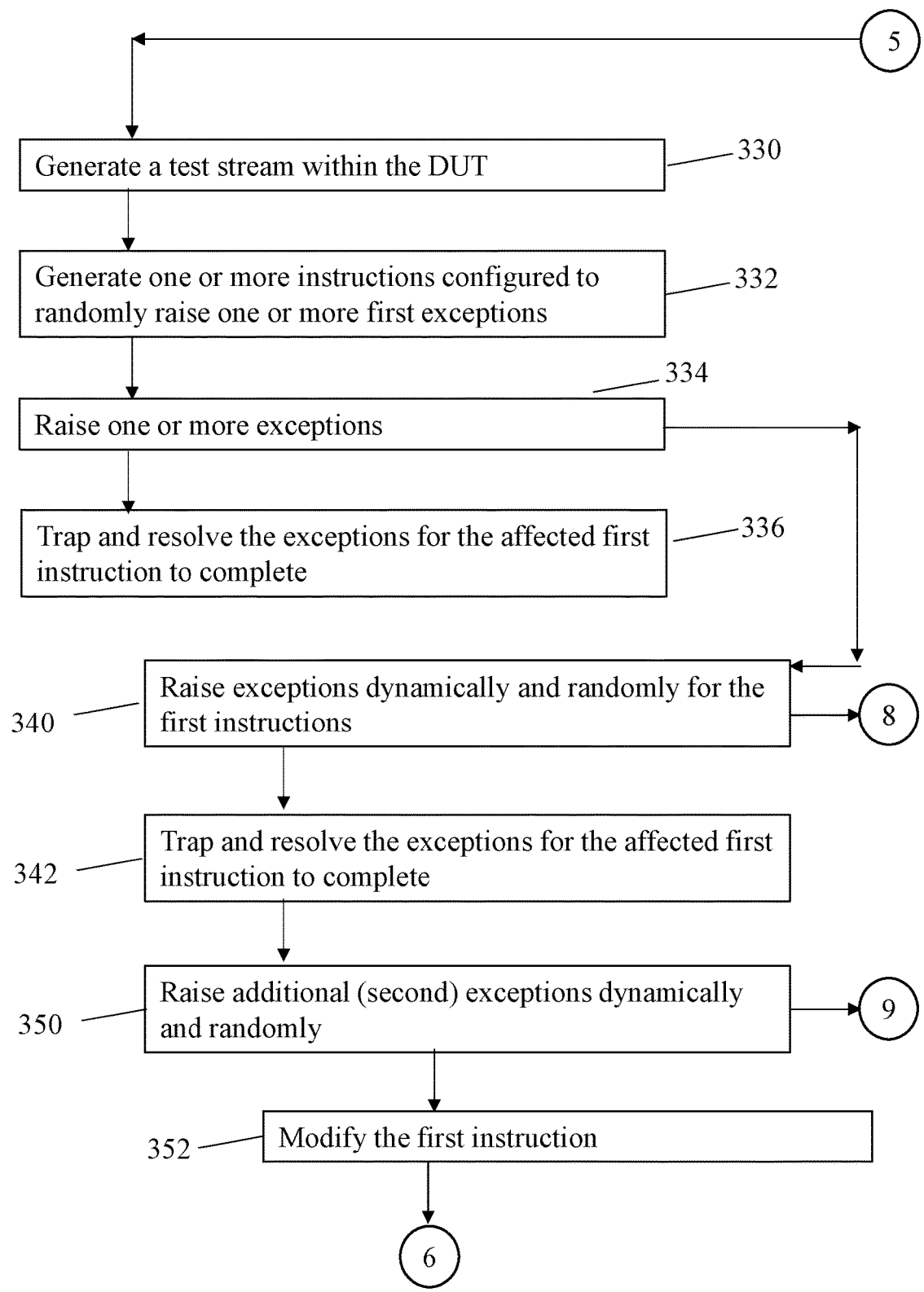
Figure 3:
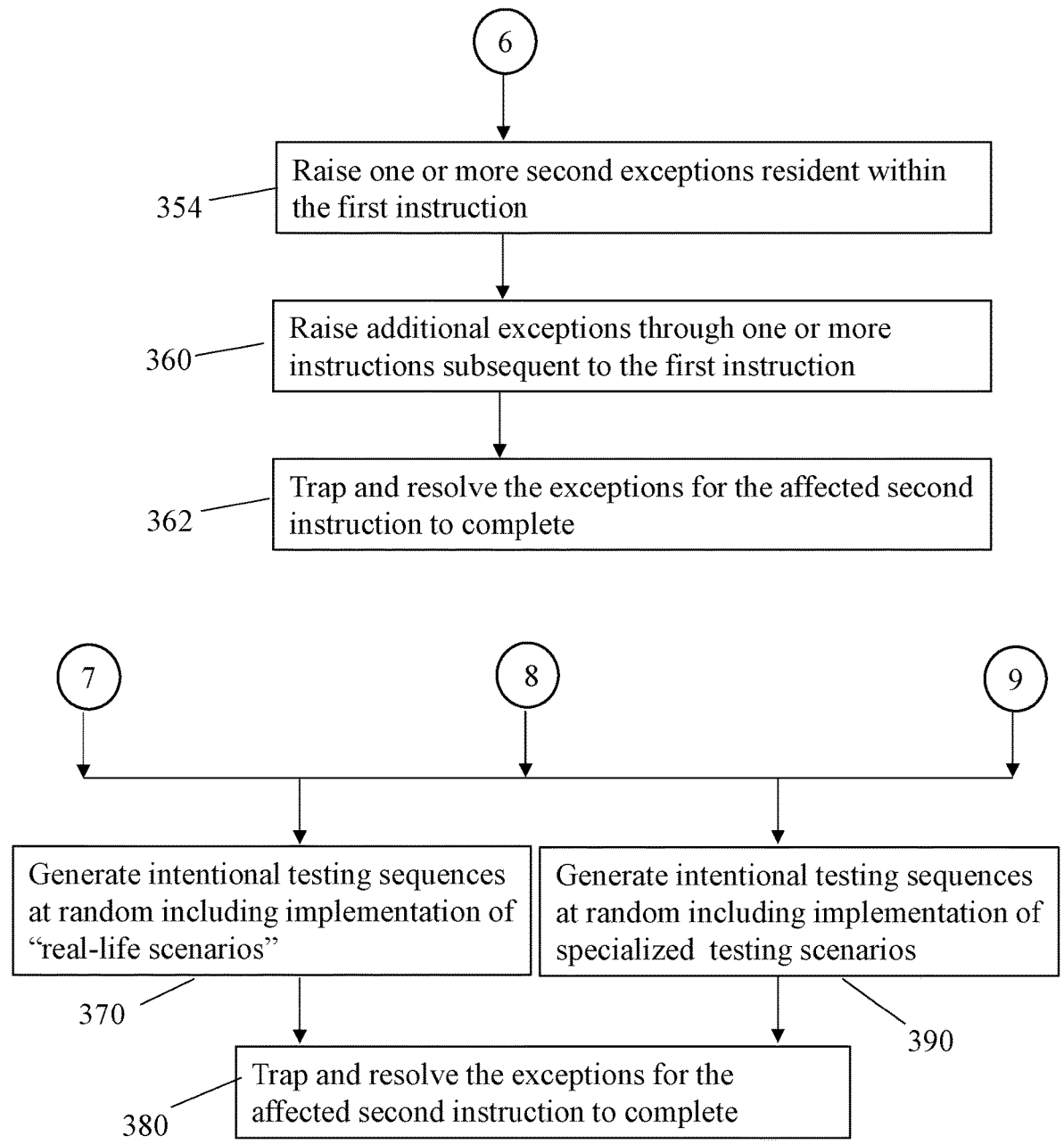

Referring to FIG. 3, a flowchart of a process 300 is provided for conducting 300 post-silicon validation testing. In one or more embodiments, the process 300 includes generation operations 302 directed toward executing one or more post-silicon validation tests for the DUT 180 through generating exceptions in the post-silicon validation testing. The generation operations 302 are closely integrated with recovery operations that are discussed further herein. Also referring to FIGS. 1 and 2, the exerciser 170 including the test program 172 with the intended test-cases is loaded 218 onto the silicon DUT 180 and the testing is executed by the DUT processor 182. The testing is performed in a sequence-to-sequence manner, where each sequence is at least a little different that the other sequences and the sequences are selected from the test program 172 to run randomly by the test generator 174. The testing is constrained to using the selected test templates 138 to generate 212 the test program 172 that will be used to conduct 300 the post-silicon validation testing. In contrast to many of the known post-silicon validation systems and methods, intentional insertion of deliberate errors into the testing, to generate the respective exceptions, is performed without the computational complexity of such known testing techniques. Intentionally generating error conditions to generate the exceptions is a computationally intense task.

The test generator 174 includes instructions for, without limitation, which errors to run and not run, and exception conditions to be generated as a result of the errors, as well as exception conditions to not be generated. Since the time allotted for post-silicon testing is typically limited and the post-silicon prototype may have limited functionality, as a result, the test sequences generated as described herein are relatively simple as compared to those of known testing schemes. Therefore, as described further herein, intentionally created exception conditions are used in the conduct 300 of the post-silicon validation testing through the test bench 100, even though at least some of the intentionally generated exceptions may be generated at random as described herein. For those exceptions that are intentionally raised, in contrast to known post-silicon validation systems and methods, "skip-to-next" techniques to handle the introduced exceptions through skipping to the next testing instruction without fully resolving the exceptions are not employed by the process 300 and the test bench 100. The test generator 174 within the exerciser 170, as loaded onto the DUT memory 184, facilitates validating the correct behavior of the DUT 180 under all of the randomly and dynamically created exception conditions.

In at least some embodiments, the conduct 300 of the post-silicon validation testing as described further herein includes two different generation and recovery operations, i.e., employment 304 of static-deterministic operations and employment 306 of dynamic-indeterministic operations. Each of the two generation and recovery operations includes one or more exception generation operations and one or more exception recovery operations. The selection of the respective generation and recovery operation is based on one or more of user preference and the nature of the exceptions to be generated during the validation, and the specific employment of each are discussed further herein.

As discussed in more detail herein, in some embodiments, the employment 304 of static-deterministic operations includes generating static-deterministic exceptions and observing the respective recoveries. To perform the static generation of the exceptions, the test generator 174 creates the variable exception conditions at test generation, where at least a portion of the various exception conditions are randomized with respect to the nature of the exceptions and the timing of the exceptions. Such randomization of insertion of the exceptions into the test-cases facilitates static generation of the random exceptions including, without limitation, deliberate creation of multi-exception conditions on a single instruction, or, in some cases, interactive instructions, and directed recoverable errors or faults on instructions. The generation condition is "static" in that the test scenarios resident within the test program already include the testing instructions to generate the predetermined exceptions, even though the actual insertion of the exceptions may be random. The random insertion of predetermined exception conditions into the test sequences prior to the initiation of the testing facilitates randomly raising exceptions without incurring the computationally heavy overhead within the test templates and the generator program.

The generation condition is "deterministic" in that the exception recovery operations include the one or more exception handlers 176 to recover the trapped exceptions and return to execute the current instruction. In at least some embodiments, the exception handlers are pre-built software artifacts that are provided as part of the exerciser software. The respective exception handlers' ability to recover from various exception conditions is therefore deterministic in nature. In at least some embodiments, the exception handlers 176 are pre-built software artifacts that are created as part of the exerciser software in conjunction with the respective created exception conditions. An exception is "trapped" when the exception is discovered by the CPU, the type of exception and the state of the program execution when it occurred are used to create an exception object, and the exception object is passed to the exception handlers to resolve the exception through employing specialized code such that execution of that particular instruction that initiated the exception may complete. In the deterministic exception recovery operations as used herein, the exceptions are substantially universally resolved through predetermined, i.e., deterministic mechanisms. In some embodiments, exceptions that would typically employ 304 a static-deterministic operation include, without limitation, page faults, protection faults, alignment faults, security faults, and watch-point events. Accordingly, for those exceptions that are randomly inserted with predetermined exception conditions into the test sequences and are trapped and resolved for the affected instruction to complete, static-deterministic operations are employed 304.

In one or more embodiments, the employment 304 of static-deterministic operations includes generating 308 the test stream 194 within the DUT 180 through the test generator 174 operably coupled to the test program 172. In addition, the generating operation 308 includes generating 310, through the test program 172, a first instruction configured to randomly generate one or more first exceptions, where the test stream 194 includes the first instruction and the one or more first exceptions. In some embodiments, for example, for those embodiments that employ static-deterministic operations, the generation operation 302 include randomly tampering with the test stream generation operations 308 by injecting errors into the test stream 194 that can be resolved/recovered during test execution via the respective exception handler 176, such tampering being performed prior to the commencement of the testing. In some embodiments, for employment 304 of the static-deterministic operations, the generation operations 302 include adding the random generation of intentional recoverable errors in the generated instruction test stream 194. In some embodiments, the test generator 174 creates the variable exception conditions at generation 308 of the test stream 194, where the various exception conditions are randomized with respect to the nature of the exceptions and the timing of the exceptions. Further, in some embodiments, the randomization is done across various exception conditions from a set of resolvable/recoverable exceptions, thereby facilitating creation of multi-exception conditions. Accordingly, generating 310 a first instruction configured to randomly raise one or more first exceptions includes injecting one or more instructions into the test stream 194 to generate, or employ 304 static-deterministic exception generation and recovery operations, where the recovery operations are described further herein.

In at least some embodiments, exceptions are raised 312. In at least some embodiments, exceptions are raised 312 statically, and in some embodiments, randomly. More specifically, the first instruction configured to randomly generate one or more first exceptions includes an exception raised through the test generator 174 executing the test program 172. The exception is trapped and resolved 314 for the affected instruction to complete. In some embodiments, the entire set of test-cases include only such exceptions and those embodiments will not be discussed further. In some embodiments, the one or more first exceptions are trapped and resolved 314, at least partially, through the one or more exception handlers 176. In one or more embodiments, through a determination 316 is made with respect to whether the exception was either fully resolved, or only partially resolved. If the exception is only partially resolved, that is, the determination is "yes," the employment 304 of static-deterministic operations returns to raising 312 one or more exceptions to re-execute the one or more exceptions. In some embodiments, a finite number of loops between operation 316 and operation 312 are permitted, and reaching that threshold will halt the test. If the exception is fully resolved, that is, the determination is "no", the employment 304 of static-deterministic operations proceeds to a determination 318 operation directed toward continuing to execute static-deterministic operations or not. In those embodiments where the testing sequences are exclusively static-deterministic, or at least the next test-case is static-deterministic, i.e., the determination 318 is "yes," the employment 304 of static-deterministic operations continues generating 318 the next instruction configured to randomly raise one or more next exceptions and returns to raising 312 one or more exceptions. In some embodiments, the determination 318 is "no" and the employment 304 of static-deterministic operations proceeds to a determination operation 320 to determine 320 whether to proceed to executing 306 dynamic indeterministic operations. If the determination 320 is "yes," the process 300 proceeds to executing 306 dynamic indeterministic operations. If the determination is "no," the process 300 ends 322. In at least some embodiments, the exception conditions created through the static-deterministic operations 304 may be employed to analyze resolution of, for example, and without limitation, page faults, protection faults, alignment faults, security faults, and watch-point events.

Continuing to refer to FIG. 3, and FIGS. 1 and 2, and as previously discussed, the flowchart of the process 300 for conducting 300 post-silicon validation testing includes, in one or more embodiments, employment 306 of dynamic-indeterministic operations. Each of the two generation and recovery operations includes one or more exception generation operations and one or more exception recovery operations. The selection of the generation and recovery operation is based on one or more of user preference and the nature of the exceptions to be raised during the validation, and the specific employment of each are discussed further herein. In some embodiments, the testing scenarios include exclusively dynamic-indeterministic operations 306. In some embodiments, static-deterministic operations 304 and dynamic-indeterministic operations 306 are executed in parallel. In some embodiments, dynamic-indeterministic operations 306 are executed in those test-cases where exceptions resolved 314 through static-determinate operations 304 proceed to executing 306 dynamic-indeterministic operations for creating multi-exception conditions as discussed further herein.

As discussed in more detail herein, in some embodiments, the employment 306 of dynamic-indeterministic operations includes raising dynamic exceptions and observing the respective indeterminate recoveries. To perform the dynamic raising of the exceptions, the generation of the test instructions with the embedded fault conditions to raise one or more exceptions is similar to that described for the static generation operations as previously described. However, in contrast to the static generation operations, where the random exception conditions are inserted prior to the start of the testing, for the dynamic generation operations, the test generator 174 creates the variable exception conditions at test generation, where the various exception conditions are randomly introduced on the fly during the test execution. Therefore, such randomization of insertion of the exceptions into the testing sequences facilitates generation of random exceptions. In some embodiments, exceptions that would typically employ dynamic-indeterministic operations 306 include, without limitation, multi-threaded test scenarios where various threads introduce exception conditions to other threads. e.g., without limitation, one thread loads, and the other thread invalidates the load address in a loop. In addition, another example of exceptions raised through dynamic-indeterministic generation operations include, without limitation, deliberate creation of multi-exception conditions on a single instruction, or, in some cases, interactive instructions. The generation condition is "dynamic" in that the test scenarios resident within the test program do not include testing instructions to raise static predetermined exceptions prior to the commencement of testing. The random insertion of exception conditions into the test sequences on the fly facilitates randomly raising exceptions without incurring the computationally heavy overhead within the test templates and the generator program.

The recovery condition is "indeterministic" in that the recovery operations include the one or more exception handlers 176, residing in the exerciser 170, to attempt to recover the trapped exceptions. However, unlike a deterministic recovery operation, where an exception is resolved and the DUT 180 continues to execute the current instruction, in the indeterministic condition the exception handlers 176 recover, at least partially, in a random fashion, e.g., in some instances the exception handlers 176 recover all types of exceptions, or recover only partially recover randomly selected conditions. In addition, the dynamic-indeterministic operations 306 leverage the exception handlers 176 to dynamically generate subsequent exceptions upon at least partial recovery from the initial exceptions. Accordingly, for those exceptions within multi-threaded test scenarios that are trapped, dynamic-indeterministic operations are employed 306.

In one or more embodiments, the employment 306 of dynamic-indeterministic generation and recovery operations includes generating 330 the test stream 194 within the DUT 180 through the test generator 174 operably coupled to the test program 172. In addition, the generating operation 330 includes generating 332, through the test program 172, a first instruction configured to randomly raise 334 one or more first exceptions, where the test stream 194 includes the first instruction and the one or more first exceptions. In some embodiments, for example, for those embodiments that employ 306 dynamic-indeterministic operations, the generation operation 332 includes injecting errors into the test stream 194, once the testing has commenced, that are resolved/recovered during test execution via the respective exception handler 176. In some embodiments, the test generator 174 creates the variable exception conditions at generation 358 of the test stream 194, where the various exception conditions are randomized with respect to the nature of the exceptions and the timing of the exceptions, where the randomization is done across various exception conditions from a set of resolvable/recoverable exceptions, thereby facilitating creation of multi-exception conditions. Accordingly, generating 332 one or more instructions configured to randomly raise 334 one or more first exceptions includes injecting one or more instructions into the test stream 194 to generate, or employ 306 dynamic-indeterministic exception generation and recovery operations, where the recovery operations are described further herein.

In at least some embodiments, one or more exceptions are raised 334. More specifically, the first instruction configured to randomly raise one or more first exceptions includes an exception raised through the test generator 174 executing the test program 172. The exception is trapped and resolved 336 for the affected instruction to complete. In some embodiments, the entire set of test-cases include only resolvable exceptions generated through operation 334 that are trapped and resolved 336 with no further actions and those embodiments will not be discussed further.

In at least some embodiments, exceptions are raised 340 dynamically and randomly at generation 332 of the present instructions. In one or more embodiments, the generation operations 302 include facilitating non-deliberate creation of multi-exception conditions on a single instruction, or, in some cases, interactive instructions. In at least some embodiments, the single-instruction, multi-exception conditions may be employed to analyze resolution of, for example, and without limitation, multi-threaded test scenarios where various threads introduce exception conditions to other threads. e.g., without limitation, one thread loads, and the other thread invalidates the load address in a loop. Accordingly, dynamically and randomly creating multi-exception conditions on a single instruction facilitates a through testing of the DUT's 180 abilities to correctly resolve substantially worse-case multiple exception scenarios.

Therefore, in at least some embodiments, to execute the raising 340 of exceptions dynamically and randomly, the respective error and faults that are implemented to raise 340 exception conditions are injected into the instructions as they are generated within the test stream 194. The indeterministic recovery operations 342 include the one or more exception handlers 176 recovering 342 the trapped exceptions. However, unlike a static-deterministic operation 304, where an exception is resolved and the DUT 180 continues to execute the current instruction, in the indeterministic condition the exception handlers 176 recover in a random fashion, e.g., in some instances the exception handlers 176 recover all types of exceptions, or only partially recover randomly selected conditions. Those partial recoveries are handled in a manner similar to that as operation 316. Therefore, for those exceptions within multi-threaded test scenarios that are trapped, dynamic-indeterministic operations are employed 306. Accordingly, injecting recoverable exception conditions dynamically and randomly by the test generator 174 results in generating one or more conditions for resolution within the test stream 194, and any "skip-to-next" instructions are excluded from the test program 172.

The respective exception handlers 176 resolve 342 the multiple exceptions in the proper order that facilitates proper operation of the DUT 180, and complete the operation of the affected instruction. Accordingly, as the generation operations randomly and dynamically create recoverable errors in the generated instruction test stream during test execution, the exceptions are trapped and recovered 342 by the exception handlers 176, resulting in a continuous test stream that complies with the original scenario of the user. In addition, in some embodiments, the one or more first exceptions are trapped and resolved 342 through the one or more exception handlers 176 with additional exception generation pending as discussed further.

In at least some embodiments, to execute the raising 350 of additional exceptions dynamically and randomly, in conjunction with the exception recovery operation 342, the dynamic generation includes modifying 352 the first instruction, through the one or more exception handlers 176, subject to the resolution 342 of the one or more first exceptions. The modification 352 of the first instruction raises 354, through the one or more exception handlers 176, one or more second exceptions resident within the first instruction. More specifically, the respective exception handler 176 injects the one or more second exception conditions into the first instruction within the test stream 194, where the one or more second exception conditions are injected through applying recoverable exception conditions dynamically and randomly to the first instruction. In at least some embodiments, the cycle of "recoverable exception conditions injection-to-at least partial recovery from the exceptions" may continue until the testing has exhausted the respective portion of the test associated with the respective first instruction. Accordingly, injecting recoverable exception conditions dynamically and randomly by the respective exception handler 176 results in generating one or more conditions for resolution within the test stream 194, where the test program 172 does not include such instructions for generating the one or more conditions, and any "skip-to-next" instructions are excluded from the test program 172.

Therefore, in at least some embodiments, exceptions may be raised statically and dynamically. In one or more embodiments, the generation operations include facilitating deliberate creation of multi-exception conditions on a single instruction, or, in some cases, interactive instructions. In some embodiments, the multi-exception conditions are created by the respective exception handler 176, implemented to generate the respective self-modifying exceptions, during a recovery from a first exception condition.

In addition, combining multiple exception conditions on a single instruction may be used to analyze and verify that all the test exceptions on that instruction are generated and resolved in the correct order, thereby verifying the proper sequencing of the recovery operations for most efficient and effective recoveries. Furthermore, for those testing regimes that exercise scatter-store and gather-load instructions with respect to loading or storing multiple elements at a time, combining multiple exception conditions on a single instruction may be used to analyze and resolve exceptions associated with accessing non-contiguous elements through access to non-contiguous memory locations, including, without limitation, generating multiple exceptions on numerous pages in memory, generating multiple exceptions on different elements, and generating multiple exceptions of different types on the same element. Accordingly, creating multi-exception conditions on a single instruction facilitates a through testing of the DUT's 180 abilities to correctly resolve substantially worse-case multiple exception scenarios.

In one or more embodiments, in addition to raising 354 one or more second exceptions within the first instruction, the dynamic-indeterministic generation and recovery operations may be employed to generate directed additional recoverable errors on the present instruction at random in a manner that also raises 360 one or more additional exceptions through one or more instructions subsequent to the present instruction being processed. In some embodiments, the multi-exception conditions are created by the respective exception handler 176, implemented to raise the respective self-modifying exceptions, during a recovery from a first exception condition. For example, and without limitation, an intentionally inserted breakpoint (or pause) within a present instruction is used to test the DUT 180 and an exception is raised. In some embodiments, the respective breakpoint register is moved to the next instruction.

In addition, with more specificity, raising 360 one or more additional exceptions resident within the second, or subsequent instruction includes generating a subsequent, or second, instruction within the test stream 194 where the respective exception handler 176 injects, randomly and dynamically, subject to the resolution of the one or more first exceptions, one or more second exception conditions into the second instruction within the test stream 194. The resultant second exceptions are trapped and resolved 362, through the one or more respective exception handlers 176, and processing of the second instruction resumes operation of the second instruction through completion thereof. The respective exception handlers 176 resolve the additional exceptions in the proper order that facilitates proper operation of the DUT 180, and either to continue the cycle of exception insertion-to-exception resolution or complete the operation of the affected instruction. Accordingly, as the generation operations randomly and dynamically create recoverable errors in the generated instruction test stream during test execution, any exception is trapped and recovered by the exception handlers 176, resulting in a continuous test stream that complies with the original scenario of the user.

In some embodiments, static-deterministic and dynamic-indeterministic operations may be employed to generate intentional testing sequences at random including generation 370 of "real-life scenarios" that include generation of exceptions that require handling through resolution processes that are similar to those that would be employed by the intended operating system that will be used through the DUT 180. In some embodiments, the multi-exception conditions are created cooperatively through operations 310, 340, and 350, where operations 310 and 340 originate with the test stream 194 and operation 350 originates with the respective exception handler 176, implemented to generate the respective self-modifying exceptions, during a recovery from a first exception condition. For example, and without limitation, for an exception generated through a page fault, the exception handler 176 may include programming to resolve the page fault exception through validating the respective translation entries. Moreover, another non-limiting example includes exceptions generated through first fault load instructions where the exception handler will substantially simulate validating the respective translation entry of a randomly, but intentionally, inserted first fault and will update the predicate register accordingly. This testing sequence will be repeated in a loop until no further faults occur such that a successful load of all elements with no incurred fault is achieved. Furthermore, a non-limiting example includes exceptions raised through a protection fault, where the exception handler is programmed to grant the proper permission to resolve the associated exception. The respective exception handler 176 traps and resolves 380 the exceptions for the affected second instruction to complete. Accordingly, even though the operating system is absent on the bare-metal validation operations described herein, resolution of exceptions that will typically be corrected by the operating system may still be performed through the static-deterministic and dynamic-indeterministic operations within the constraints for each as described herein.

Moreover, in some embodiments, static-deterministic and dynamic-indeterministic operations may be employed to generate 390 intentional testing sequences at random including implementation of specialized testing scenarios. In some embodiments, the generation operation is developed cooperatively through operations 310, 340, and 350, where operations 310 and 340 originate with the test stream 194 and operation 350 originates with the respective exception handler 176, implemented to raise the respective self-modifying exceptions, during a recovery from a first exception condition. For example, and without limitation, the test program 172 and the exception handler 176 may be implemented to create and resolve exception conditions that are unlikely to be resolved by the operating system. Specific non-limiting examples include resolving exceptions which normally wouldn't be resolved, e.g., alignment exceptions and security exceptions. In addition, the testing scenarios may be implemented to deliberately generate conditions for multiple pending exceptions on a single instruction (as described further herein). Also, the testing scenarios may be configured to verify that the correct exception for a particular fault was taken. The respective exception handler 176 traps and resolves 380 the exceptions for the affected second instruction to complete. Accordingly, examination of specialized exceptions and the recoveries therefrom may be executed through the static-deterministic and dynamic-indeterministic operations within the constraints for each as described herein.

In at least some embodiments, the exception handlers 176 as described herein are implemented to raise the previously described self-modifying exceptions. Specifically, the exception handlers 176 are implemented to modify or replace the current instruction to introduce even broader variability and stress on the DUT's 180 exception mechanisms. For example, without limitation, the exception handlers 176 are implemented to randomly and dynamically create multiple, and different, exceptions of various conditions from a single instruction in the DUT memory 184 while the instruction itself is being modified between exception trapping. In addition, the exception handlers 176 are implemented to modify or replace the current instruction to randomly and dynamically generate different exceptions on subsequent instructions, i.e., the code may be altered dynamically as the instructions are processed. In addition, the exception handlers 176 are implemented to the aforementioned real-life scenarios and the specialized testing schemes. Accordingly, the exception handlers 176 are configured to correct errors in a partially and random manner, so that more exceptions may occur on the same instruction, or on the next instructions, upon resolution of a first exception, thereby applying exception conditions repeatedly, randomly, and dynamically during the validation test execution on any instruction(s) in the test scenarios through exception condition injection, thereby creating a cross-product effect as previously discussed herein.

The system, computer program product, and method as disclosed and described herein preserves the users' original intent of the respective test sequences through demonstrating the abilities of the device-under-test (DUT) to recover from one or more errors and exceptions while executing the associated instructions rather than merely skipping to the next instruction while conducting post-silicon validation testing. The intentional raising and handling of exceptions in post-silicon validation exercisers randomly creates recoverable errors in a generated instruction test stream. Such random raising of the exceptions eliminates the need to draft complex exception test scenarios, thereby reducing the necessity for additional manual work on the test templates. Multiple exceptions may be raised either in a single instruction or in multiple instructions, while the present instruction is permitted to fully execute. The errors responsible for generating the exceptions are automatically repaired. Accordingly, the users' original intent of the respective test sequences are preserved through demonstrating the abilities of the device-under-test (DUT) to recover from one or more errors and exceptions while executing the associated instructions rather than merely skipping to the next instruction, thereby providing a distinct improvement to the execution of the test scenarios.

Therefore, the embodiments disclosed herein provide an improvement to computer technology. For example, the generation processes as described herein facilitate test generation that is less restrictive, i.e., more computationally-light as compared to generation of pre-silicon tests. The implemented generation operations as described herein do not include features to forbid exception conditions for either the static or dynamic operations. In addition, the light weight testing implementation facilitates free creation of directed scenarios, where the users can be less experienced, and further facilitates taking multiple exceptions on the same instruction or subsequent instructions. Moreover, the generation of multi-threaded test scenarios may include test scenarios that no CSP or reference model can verify during the pre-silicon verification testing. Accordingly, the test generation as described herein facilitates stress testing the operation of the DUT.

Accordingly, the improvement to computer technology is manifested in a practical technical application of the methods described herein to execute post-silicon validation testing of hardware devices through fully executing the testing of the hardware under exception conditions, The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be appreciated that, although specific embodiments have been described herein for purposes of illustration, various modifications may be made without departing from the spirit and scope of the embodiments. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Accordingly, the scope of protection of the embodiments is limited only by the following claims and their equivalents.

What is claimed is:

1. A computer system configured to validate operation of a device-under-test (DUT) through post-silicon validation testing comprising:
   a validation computer system comprising:
      one or more processing devices; and
      one or more memory devices communicatively coupled to the one or more processing devices, the one or more processing devices configured to:
         execute one or more post-silicon validation tests on the DUT comprising:
            generate a first instruction configured to randomly raise the one or more first exceptions from one or more first exception conditions;
            modify, subject to at least partial resolution of one or more first exceptions, the first instruction; and
            raise, subject to the modifications, one or more second exceptions within the first instruction.

2. The system of claim 1 further comprising:
   a post-silicon validation platform operatively coupled to the validation computer system, the post-silicon validation platform configured to receive the DUT, the post-silicon validation platform comprising an exerciser communicatively coupled to the DUT, the exerciser comprising:
a test program generated from one or more test templates;
a test generator operatively coupled to the test program, the test generator is configured to execute the test program on the DUT and
one or more exception handlers operatively coupled to the test generator, wherein the one or more exception handlers are configured to execute, as directed by the one or more processing devices, a plurality of operations comprising:
the at least partial resolution of the one or more first exceptions;
the modification of the first instruction; and
the raising of the one or more second exceptions within the first instruction.

3. The system of claim 2, wherein:
the test generator is configured to generate a test stream within the DUT, wherein the test stream includes the first instruction and the one or more first exceptions; and
the one or more exception handlers are further configured to:
inject, subject to the at least partial resolution of the one or more first exceptions, one or more second exception conditions into the first instruction within the test stream;
raise, subject to the one or more second conditions, one or more second exceptions;
resolve, at least partially, subject to the raising of the one or more second exceptions, each of the one or more second exceptions; and
resume, subject to the resolution of the one or more second exceptions, execution of the first instruction through completion thereof.

4. The system of claim 3, wherein the one or more exception handlers are further configured to:
resolve the one or more second exceptions in a proper order such that proper operation of the DUT is facilitated.

5. The system of claim 3, wherein the test generator and the one or more exception handlers are further configured to cooperate to:
create recoverable exception conditions dynamically in the first instruction during a test execution; and
create the recoverable exception conditions randomly in the first instruction during the test execution.

6. The system of claim 5, wherein the one or more exception handlers are further configured to:
create one or more multi-exception conditions for resolution within the test stream, wherein the test program does not include all of the instructions for creating the one or more multi-exception conditions;
create one or more multi-exception conditions for resolution within the test stream, wherein at least a portion of the multi-exception conditions are self-modifying exceptions; and
fully resolve the multi-exception conditions without executing a skip-to-next technique.

7. The system of claim 3, further configured to execute static-deterministic operations and dynamic-indeterministic operations, wherein:
the test generator is further configured to:
inject one or more instructions into the test stream to raise one or more static exceptions through exception conditions statically embedded within the one or more instructions prior to commencement of the post-silicon validation tests, wherein at least a portion of the statically embedded exception conditions are embedded randomly; and
inject one or more instructions into the test stream to raise one or more dynamic exceptions through exception conditions dynamically embedded within the one or more instructions subsequent to commencement of the post-silicon validation tests, wherein the dynamically embedded exception conditions are embedded randomly; and
the one or more exception handlers are further configured to:
resolve the one or more static exceptions deterministically, wherein the one or more static exceptions are fully resolved and the respective instruction is executed to completion; and
resolve the one or more static exceptions and the one or more dynamic exceptions indeterministically, wherein the one or more static exceptions and the one or more dynamic exceptions are partially resolved and additional exception conditions are embedded into the respective instruction.

8. The system of claim 2, wherein:
the test generator is configured to generate a test stream within the DUT, wherein the test stream includes a second instruction; and
the one or more exception handlers are further configured to create exception conditions on subsequent instructions comprising:
inject, subject to the at least partial resolution of the one or more first exceptions, one or more third exception conditions into the second instruction within the test stream;
raise, subject to the one or more third conditions, one or more third exceptions;
resolve, subject to the raising of the one or more third exceptions, each of the one or more third exceptions; and
resume, subject to the resolution of the one or more third exceptions, execution of the second instruction through completion thereof.

9. A computer program product, comprising:
one or more computer readable storage media; and
program instructions collectively stored on the one or more computer storage media, the program instructions comprising:
program instructions to execute one or more post-silicon validation tests for a device-under-test (DUT) comprising:
program instructions to generate a test program from one or more test templates;
program instructions to create one or more first exception conditions and one or more respective exception handlers;
program instructions to generate, through the test program, a first instruction configured to randomly raise one or more first exceptions from the one or more first exception conditions;
program instructions to resolve, at least partially, through the one or more exception handlers, subject to the generation of the first instruction, the one or more first exceptions;

program instructions to modify, through the one or more exception handlers, subject to the resolution of the one or first exceptions, the first instruction; and program instructions to raise, through the one or more exception handlers, subject to the modifications, one or more second exceptions within the first instruction.

10. The computer program product of claim 9, further comprising:

program instructions to generate, through a test generator operably coupled to the test program, a test stream within the DUT, wherein the test stream includes the first instruction and the one or more first exceptions;

program instructions to inject, through the one or more exception handlers, subject to the at least partial resolution of the one or more first exceptions, one or more second exception conditions into the first instruction within the test stream;

program instructions to raise, subject to the one or more second conditions, one or more second exceptions;

program instructions to resolve, at least partially, through the one or more exception handlers, subject to the raising of the one or more second exceptions, each of the one or more second exceptions; and program instructions to resume, through the one or more exception handlers, subject to the resolution of the one or more second exceptions, execution of the first instruction through completion thereof.

11. The computer program product of claim 10, further comprising:

program instructions to resolve, through the one or more exception handlers, the one or more second exceptions in a proper order such that proper operation of the DUT is facilitated.

12. The computer program product of claim 10, further comprising:

program instructions to create recoverable exception conditions dynamically in the one or more of the first instruction and the second instruction during a test execution; and program instructions to create recoverable exception conditions randomly in the one or more of the first instruction and the second instruction during the test execution.

13. The computer program product of claim 9, further comprising:

program instructions to generate, through a test generator operably coupled to the test program, a test stream within the DUT, wherein the test stream includes a second instruction; and program instructions to create exception conditions on subsequent instructions comprising:

program instructions to inject, through the one or more exception handlers, subject to the at least partial resolution of the one or more first exceptions, one or more third exception conditions into the second instruction within the test stream;

raise, subject to the one or more third exception conditions, one or more third exceptions, program instructions to resolve, through the one or more exception handlers, subject to the raising, each of the one or more third exceptions; and program instructions to resume, subject to resolving the one or more third exceptions, execution of the second instruction through completion thereof.

14. A computer-implemented method for validating operation of a device-under-test (DUT) through post-silicon validation testing comprising:

executing one or more post-silicon validation tests for a device-under-test (DUT) comprising:

generating a first instruction configured to randomly raise the one or more first exceptions from one or more first exception conditions;

modifying, subject to at least partial resolution of one or first exceptions, the first instruction; and raising, subject to the modifications, one or more second exceptions within the first instruction.

15. The method of claim 14, wherein raising one or more second exceptions resident within the first instruction comprises:

generating a test stream within the DUT, wherein the test stream includes the first instruction and the one or more first exceptions;

injecting, subject to the at least partial resolution of the one or more first exceptions, one or more second exception conditions into the first instruction within the test stream;

raising, subject to the one or more second conditions, one or more second exceptions;

resolving, at least partially, subject to the raising of the one or more second exceptions, each of the one or more second exceptions; and resuming, subject to the resolution of the one or more second exceptions, execution of the first instruction through completion thereof.

16. The method of claim 15, wherein resolving each of the one or more second exceptions comprises:

resolving the one or more second exceptions in a proper order such that proper operation of the DUT is facilitated.

17. The method of claim 15, wherein injecting the one or more second exception conditions into the test stream comprises:

creating recoverable exception conditions dynamically in the first instruction during a test execution; and creating the recoverable exception conditions randomly in the first instruction during the test execution.

18. The method of claim 17, wherein creating the recoverable exception conditions dynamically and randomly comprises:

creating one or more multi-exception conditions for resolution within the test stream, wherein the test program does not include all of the instructions for generating the one or more multi-exception conditions;

creating one or more multi-exception conditions for resolution within the test stream, wherein at least a portion of the multi-exception conditions are self-modifying exceptions; and resolving, fully, the multi-exception conditions without executing a skip-to-next technique.

19. The method of claim 15, further comprising:

executing static-deterministic operations comprising:

injecting one or more instructions into the test stream to raise one or more static exceptions through exception conditions statically embedded within the one or more instructions prior to commencement of the post-silicon validation tests, wherein at least a portion of the statically embedded exception conditions are embedded randomly; and resolving the one or more static exceptions deterministically, wherein the one or more static exceptions are fully resolved and the respective instruction is executed to completion; and executing dynamic-indeterministic operations comprising:
- injecting one or more instructions into the test stream to raise one or more dynamic exceptions through exception conditions dynamically embedded within the one or more instructions subsequent to commencement of the post-silicon validation tests, wherein the dynamically embedded exception conditions are embedded randomly; and
- resolving the one or more static exceptions and the one or more dynamic exceptions indeterministically, wherein the one or more static exceptions and the one or more dynamic exceptions are partially resolved and additional exception conditions are embedded into the respective instruction.

20. The method of claim 14, further comprising:
generating a test stream within the DUT, wherein the test stream includes a second instruction; and
creating exception conditions on subsequent instructions comprising:
- injecting, subject to at least partial resolution of the one or more first exceptions, one or more third exception conditions into the second instruction within the test stream;
- raising, subject to the one or more third exception conditions, one or more third exceptions;
- resolving, subject to the raising, each of the one or more third exceptions; and
- resuming, subject to resolving the one or more third exceptions, operation of the second instruction through completion thereof.

* * * * *